United States Patent [19]

Kopp et al.

[11] Patent Number: 5,090,362
[45] Date of Patent: Feb. 25, 1992

[54] ARRANGEMENT FOR GALVANIZATION OF TREATMENT GOODS IN A SERIES OF BATHS

[75] Inventors: Lorenz Kopp, Altdorf; Heinrich Knorr; Werner Rossmann, both of Feucht, all of Fed. Rep. of Germany

[73] Assignee: Schering Aktiengesellschaft, Berlin and Bergkamen, Fed. Rep. of Germany

[21] Appl. No.: 495,466

[22] Filed: Mar. 16, 1990

[30] Foreign Application Priority Data

Mar. 17, 1989 [DE] Fed. Rep. of Germany ....... 3908778

[51] Int. Cl.⁵ ................................................ B05C 3/09
[52] U.S. Cl. ...................... 118/423; 118/425; 118/500; 118/501; 118/DIG. 7
[58] Field of Search .............. 118/61, 423, 425, 500, 118/DIG. 7, 501

[56] References Cited

U.S. PATENT DOCUMENTS

3,262,420  7/1966  Bossi et al. ............ 118/425 X
3,986,518 10/1976  Sato ....................... 118/425 X
4,421,054 12/1983  Stavros ................... 118/63
4,755,273  7/1988  Bassett et al. ........ 118/423 X Primary Examiner—Michael G. Wityshyn
Attorney, Agent, or Firm—Michael J. Striker

[57] ABSTRACT

An arrangement for galvanization of treatment goods, such as for example electronic printed circuits, comprises a plurality of successively arranged baths accommodated in bath container units having open sides, covers for selectively covering the upper sides of the container units, units for aspirating vapors located in the bath containers above a liquid level of a bath liquid, units for introducing and withdrawing treatment goods into and out of the bath. The aspirating units include air aspiration inlets located at such a distance under an upper edge of the container units that whirling of an aspirated air is substantially eliminated and a substantial part of the vapors in a space above the liquid level is entrained by the aspirated air. The aspirating inlets are arranged above a maximum bath height, and the cover being arranged at such a height and being dimensioned relative to the container units so that an air passage is produced between the cover and the container unit.

22 Claims, 8 Drawing Sheets

ARRANGEMENT FOR GALVANIZATION OF TREATMENT GOODS IN A SERIES OF BATHS

BACKGROUND OF THE INVENTION

The present invention relates to an arrangement for galvanization of treatment goods in a series of baths arranged one after the other. More particularly, it relates to such an arrangement in which the baths are open at their upper sides and provided with covers for selective closing of the upper sides with a suction of vapors located in the bath containers above the liquid level of the bath liquid and with a transporting car for introducing and withdrawing the treatment goods in and from the baths.

Originally the bath containers were left open at their upper side and therefore it had to be taken into consideration that the vapors formed above the baths liquid are dispersed, and can be withdrawn from it only insufficiently. In view of this an arrangement was proposed in the German document DE-OS 3,530,322 in which the upper side of the bath containers or suction devices provided in them can be completely closed by a cover. Air entrance slots are provided almost directly under the upper edge of the suction device in its wall. The cover has walls provided underneath and serving both for centering and insertion of the cover. In the closed condition of the bath containers the walls are located in front of the air suction slot and therefore form a path of increased air resistance in the air path to the suction slots. When the container is open at the upper side for introducing or withdrawing of the goods to be treated, the cover together with the catching shell is removed and displaced to the side. The movement of the cover and the catching shell is therefore coupled. When in the arrangement in accordance with the German document DE-OS 3,530,322 a desired reduction of the exhaust air quantity with the placed cover is achieved, a significant reduction of the exhaust quantity through a tight cover of the total treatment space both in other known arrangements as well as in the arrangement of the German document DE-OS 3,530,322 is disadvantageous. In the first mentioned case damaging gases can escape to the surrounding atmosphere in openings for conductors and current contact rail guides or the like. In the second mentioned case there is a danger that during the aspiration step the negative pressure produced in the container interior or between the suction devices fixes the cover so that its lifting is possible only with overcoming of this negative pressure, in some cases this is difficult. Furthermore, the above mentioned positioning of the suction slot is disadvantageous. A very high portion of surrounding air is aspirated, or in other words the exhaust quantity is correspondingly increased opposite to the desired object. The aspirated air is strongly whirled on the very short path between the upper edge of the suction device and its air suction slots. Furthermore, the region between the suction slots and the upper surface of the bath liquid located in the container is not flown by the suction air, so that the vapors located there are aspirated. During traveling of the treatment goods in the station and removal of the goods, the cover must be lifted. The damaging gases escape especially intensely during the withdrawal. The arrangement of the air slots in accordance with the German document DE-OS 3,530,322 is not favorable for this operational condition, since a greater part of the surrounding air is aspirated. The action of the suction device is therefore very affected and by increase of the aspirated air quantity can be compensated only insufficiently. The above mentioned coupling of the movement of the cover and the movement of the catching shell has also the disadvantage that the associated transporting cars cannot be equipped as spraying cabins with a catching shell which during spraying of the treatment products are located under them.

SUMMARY OF THE INVENTION

Accordingly, it is an object of the present invention to provide an arrangement for galvanization of treatment goods in a series of baths, which avoids the disadvantages of the prior art.

More particularly, it is an object of the present invention to provide an arrangement for galvanization of treatment objects in a series of baths, in which the aspiration of the produced vapors is improved with maintaining the object of a minimum possible exhaust quantity.

In keeping with these objects and with others which will become apparent hereinafter, one feature of the present invention resides, briefly stated, in an arrangement of the above mentioned type, in which the air inlet or aspiration openings or aspiration slots are located at such a distance under the upper edge of the container or the upper edge of the unit of a container and aspirators, that whirling of the aspirated air is avoided and a substantial portion of the liquid vapors in the space above the liquid level of the bath is entrained by the aspirated air stream, the aspiration openings or aspiration slots are located above the maximum bath height, and the height and dimensioning of the cover relative to the container or the aspirators is selected so that between the cover and the container or the aspirators an air passage is produced at both sides.

When the arrangement is designed in accordance with the present invention with a desired reduction of the exhaust quantity substantially more vapors are aspirated than in prior art, since the aspiration openings or slots are located correspondingly deep in the space filled with vapors between the liquid level and the upper edge of the container or the aspirating device. The cover substantially covers the upper side of the container, and at the same time it is known that in this cover position air can flow in between the cover side edges and the container or the suction device located on it. This eliminates the prior art disadvantage in forming an excessive negative pressure which aspirated the cover and leads only insignificantly to the evaporation of the bath operating at most at high temperatures. On the other hand, first of all this air flows through the space between the cover and the aspiration slots and thereby transports the vapors of the treatment liquid located there downwardly into the aspiration slots and withdraws through them. Since the aspirating device runs continuously and thereby provides permanently the above mentioned transporting movement for the air with the vapor in it, practically no vapor can escape to the surrounding atmosphere. Due to the great distance between the aspirating slots and the upper side of the container or the aspirating device, the disadvantageous whirling formations of the aspirated air are avoided. Such whirling formations were first of all damaging in the stages of the working process in such a galvanization installation in which the cover must be removed for the insertion or withdrawal of the goods and pivoted to the side. The support is needed for such a proper positioning of the cover in the covering position, so that the aspiration device must not be used for this.

In accordance with another feature of the present invention, the transporting car is provided with a device for lifting the cover from the containers and for placing the lifted cover in a position outside the movement path of the treatment goods and also for the reverse order of the above steps. The arrangement for lifting and placing the covers is independent from the movement arrangement of the catching shell for catching treatment liquid dripping from the treatment goods. Thereby the movement devices of the cover and the shell can be designed relatively simple and placed on different sides of the transporting car. Moreover, there is an advantage in that the transporting car is formed as a spraying cabin and can catch the downwardly running spraying water (including the sprayed treatment liquid) from the catching shell and withdraw the same.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

Figure 1:
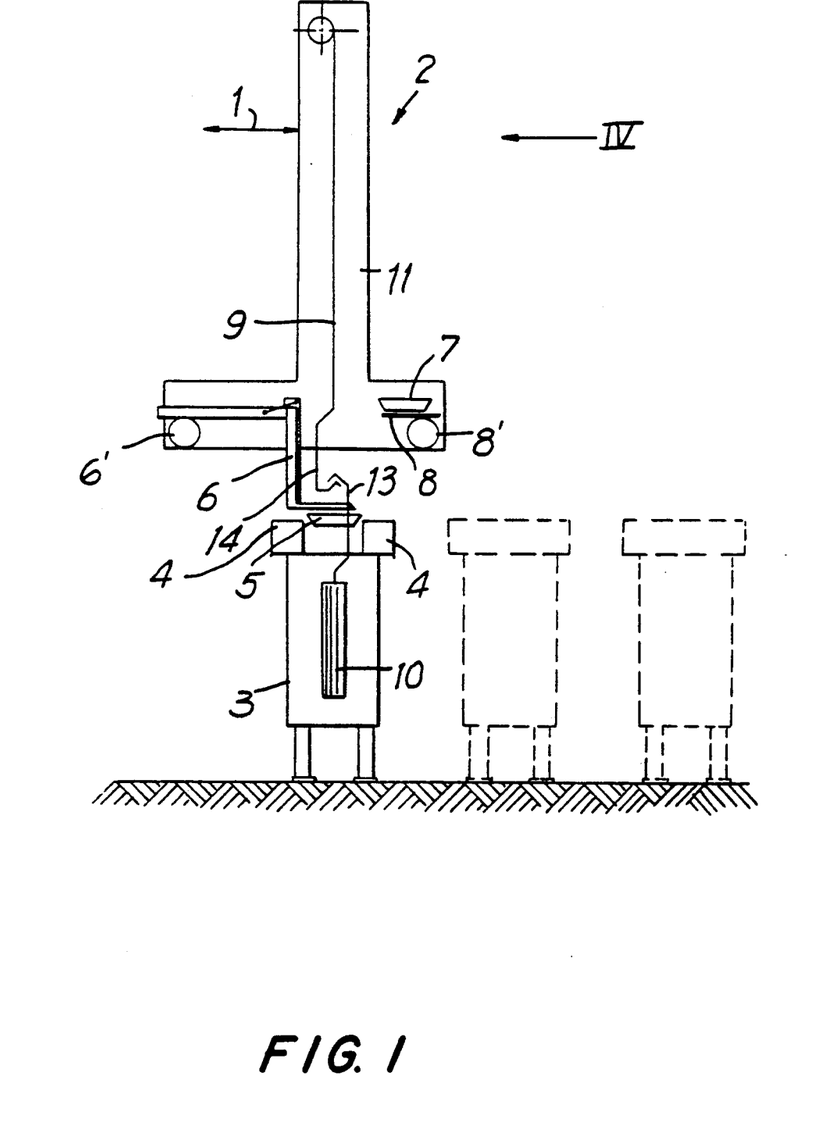
FIGS. 1-3 are side views of a transporting car and bath container at different stages of a working process.

FIG. 1 shows a region of a galvanization arrangement in accordance with the present invention. It is provided with a series of several treatment stations arranged one after the other. One of the stations is shown in principle in solid lines, while two further stations are shown in broken lines. The longitudinal direction of the arrangement is identified with reference numeral 1 and corresponds to the direction of movement a transporting car 2. Each treatment station includes a bath container 3 with aspiration cells 4 and a cover 5. The construction of the same is shown in FIGS. 5-8.

Figure 4:
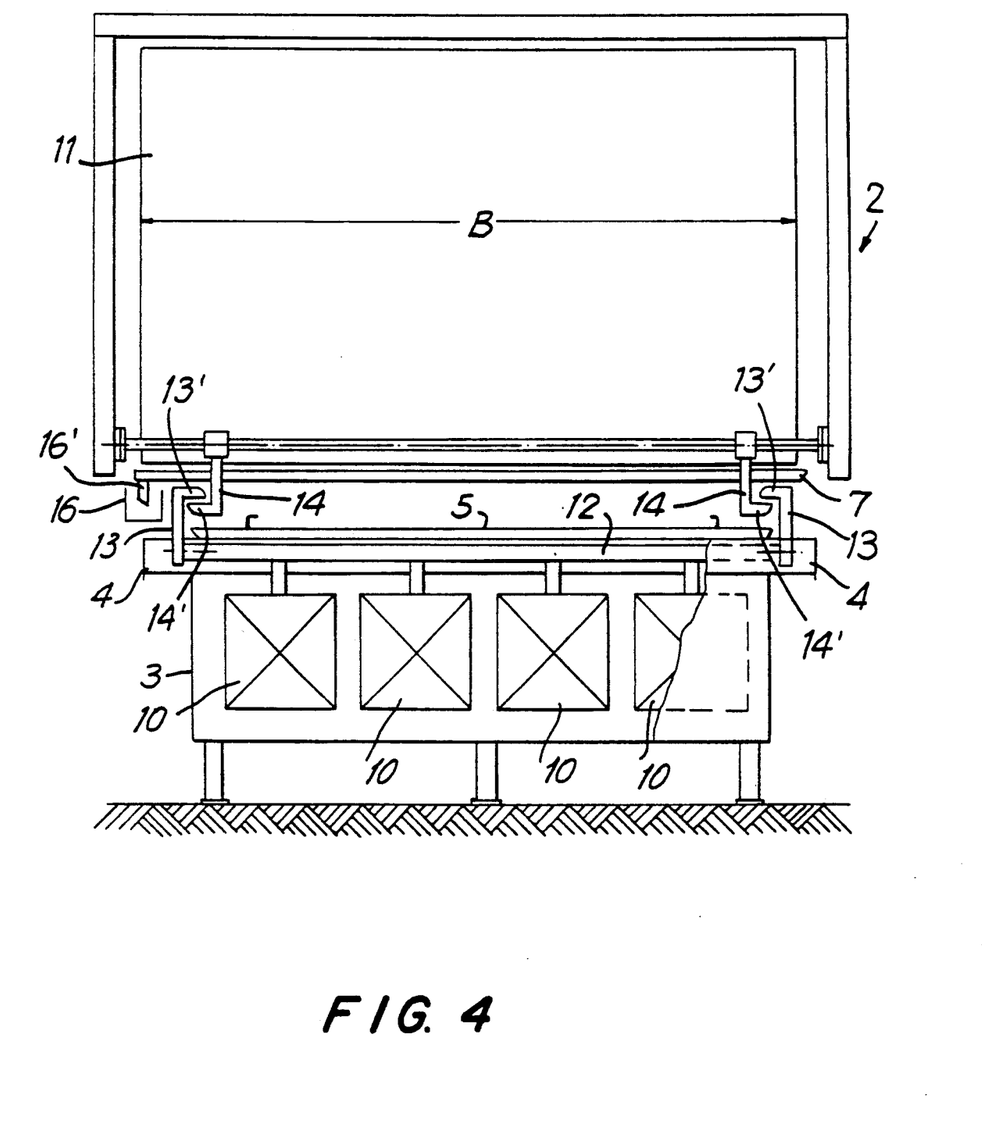
FIG. 4 is a view as seen in the direction of the arrow IV in FIG. 1.

A device 6 for lifting and moving the covers to the side is located on the transporting car. Also, a catching shell 7 with an associated movement device 8 and a lifting device 9 for treatment goods 10 are arranged on the transporting car. Further, the transporting car can be formed at 11 as a spraying cabin with associated not shown spraying devices. The view of FIG. 4 shows at the one hand the above mentioned structural elements of the transporting car and the upper region of the treatment station located under it, as well as a goods support 12, its supporting arms 13 with angled portions 13', and gripping arms 14 with their angled portions 14' of the transporting car. It can be seen that due to the design of the arms 13, 14 and the direction of their angled portions 13', 14' transverse to the traveling direction 1 of the transporting car 2, it can move over the whole length of the arrangement without colliding with the parts 13, 13'. When in one treatment station the product must be removed or lowered, the angled portions 14' come to abutment against the lower sides of the angled portion 13'.

FIG. 1 shows how the transporting car moves empty to an occupied station. Its supporting arms 14, 14' are in the lower position. The cover is located on the upper side of the container or the aspiration cells and the catching shell is moved to the side to its non-used position. The lifting device 6 for lifting of the cover is brought in its working position. Then, as can be seen from FIG. 2, the cover 5 is lifted and displaced to the side. Thereby, the upper side 15 of the bath container opens, and the product 10 to be treated can be lifted to the position shown in FIG. 2 and when needed sprayed there. After the withdrawal of the product from the container 3, the catching shell is brought under the lifted treatment product and the cover 5 is again brought to its initial covering position, as shown in broken line and identified with reference numeral 5'. Then, the transporting car is moved to a next treatment station, to deposit to a cleaning station or the like. It is of advantage in the arrangement in accordance with the present invention that the transporting car can be moved both with its lifting arms 14, 14' to lower position shown in FIG. 1 and also to its upper position shown in FIG. 2 through any number of stations, or in other words a fast sequence of the transporting steps is possible.

Figure 3:
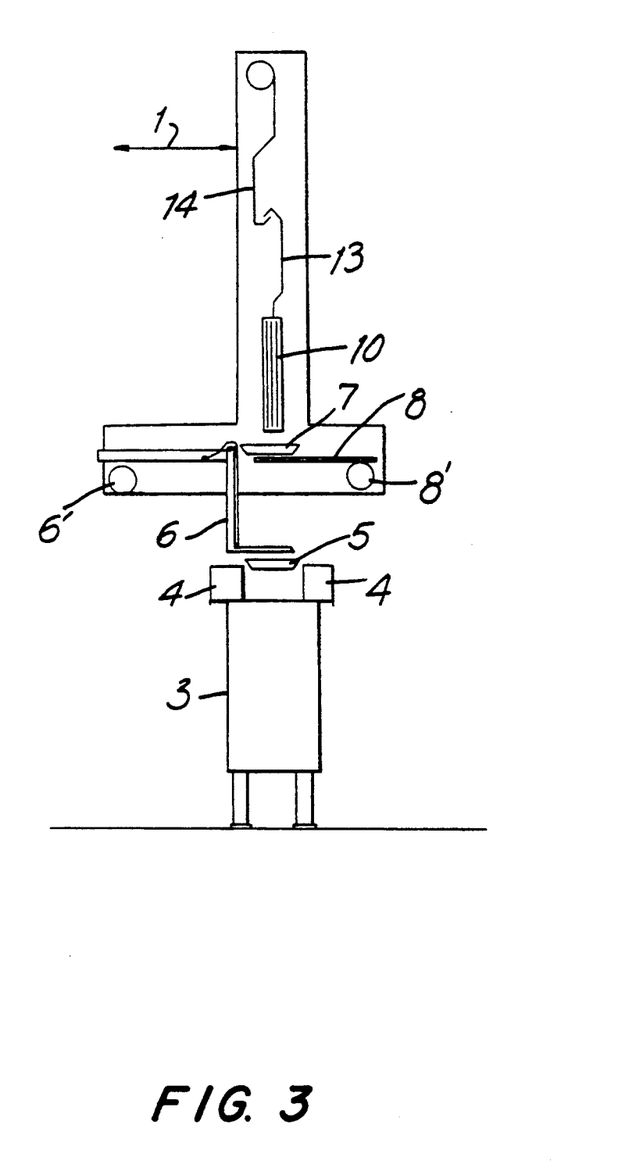

The deposit of a treatment product from the transporting car into a treatment station is shown in FIG. 3. During operation of this station the treatment product is lifted by the arms 13, 14 and the catching shell 7 is located in its working position. The cover 5 is in the covering position of the container 3. Then the movement device 6 of the cover is brought to its working position and the cover is lifted and moved to the side as shown in broken lines and identified with reference numeral 5'' in FIG. 5. Moreover, the catching shell 8 moves to the side as not shown. Finally, the treatment product 10 is lowered into the container 3 and the cover is again brought into the shown position. Subsequently, the transporting carriage 3 is moved back.

From the foregoing it can be seen that the movement device 6 for the cover and the movement device 8 for the catching shell are independent from one another. The catching shell 7 is displaced by its movement device 8 in the transporting direction 1 of the transporting car 2 relative to the latter. It can slide with guiding rollers in corresponding not shown rails of the transporting car. The associated drive motor is identified with reference numeral 8', while a drive motor of the movement device for the cover is identified with reference numeral 6'. The non-used position of the catching shell 7 in accordance with FIG. 1 is outside of the movement path of the arms 13, 14 and the treatment product as well as the goods support as shown in FIGS. 1, 4.

Figure 2:
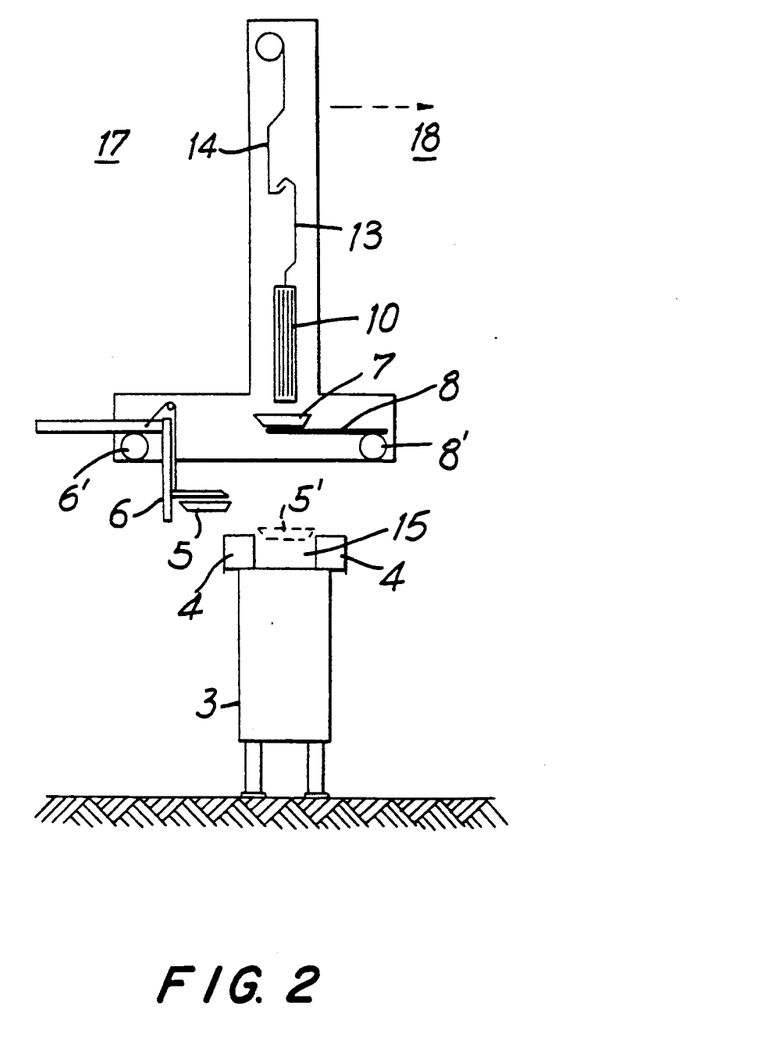

In the preferable embodiment of the invention, in which the transporting car has a spraying cabin, the catching shell in its catching position shown in FIGS. 2, 3 catches liquid which drips from the product, especially spraying water and liquid residues. The liquid which is caught by the catching shell is supplied laterally into a discharge trough 16 as shown in FIG. 4. It is important during catching the spraying water and residues from a spraying cabin that the catching shell extends over the whole effective width B of the transporting car, since this width is taken by the spraying cabin. FIG. 4 shows that with the provision of the transporting car with the spraying cabin, the catching shell 7 is drawn very far outwardly, or in other words it must be very wide when it must reach over the region B of the spraying cabin 11. The spraying cabin 11 in turn must be so wide that the total goods support can run in it. The lifting beam cannot be brought in the position shown in FIG. 1 when the catching shell is in the central position. For this reason and when a catching shell is available with continuous discharge charge through an emptying pipe 16' in a trough 16 an arrangement for the cover movement which is independent from the catching shell movement is required. This advantage is provided by the inventive solution. In the known arrangement disclosed in German reference DE-OS 3,530,322 the above mentioned advantages are not provided.

FIGS. 1-3 further show that the cover 5 and the catching shell 7 during their displacement to the non-use position are moved in opposite sides 17, 18 of the transporting car and thereby do not disturb each other in their movement course and with their transporting means.

FIGS. 5-8 show details of the design of means for air aspiration and cover movement. The catching shell and the means for its movement are not shown again for simplifying the drawings.

The walls 3' of the container transit into the upper edges 19 on which the aspiration cells 4 are supported and mounted. The respective inwardly located side wall 20 of the aspiration cell runs parallel and at the distance a from the inner side 3'' of the respective container wall and ends above the dash-dot line 21 indicating the position of the maximum high liquid level.

Figure 5:
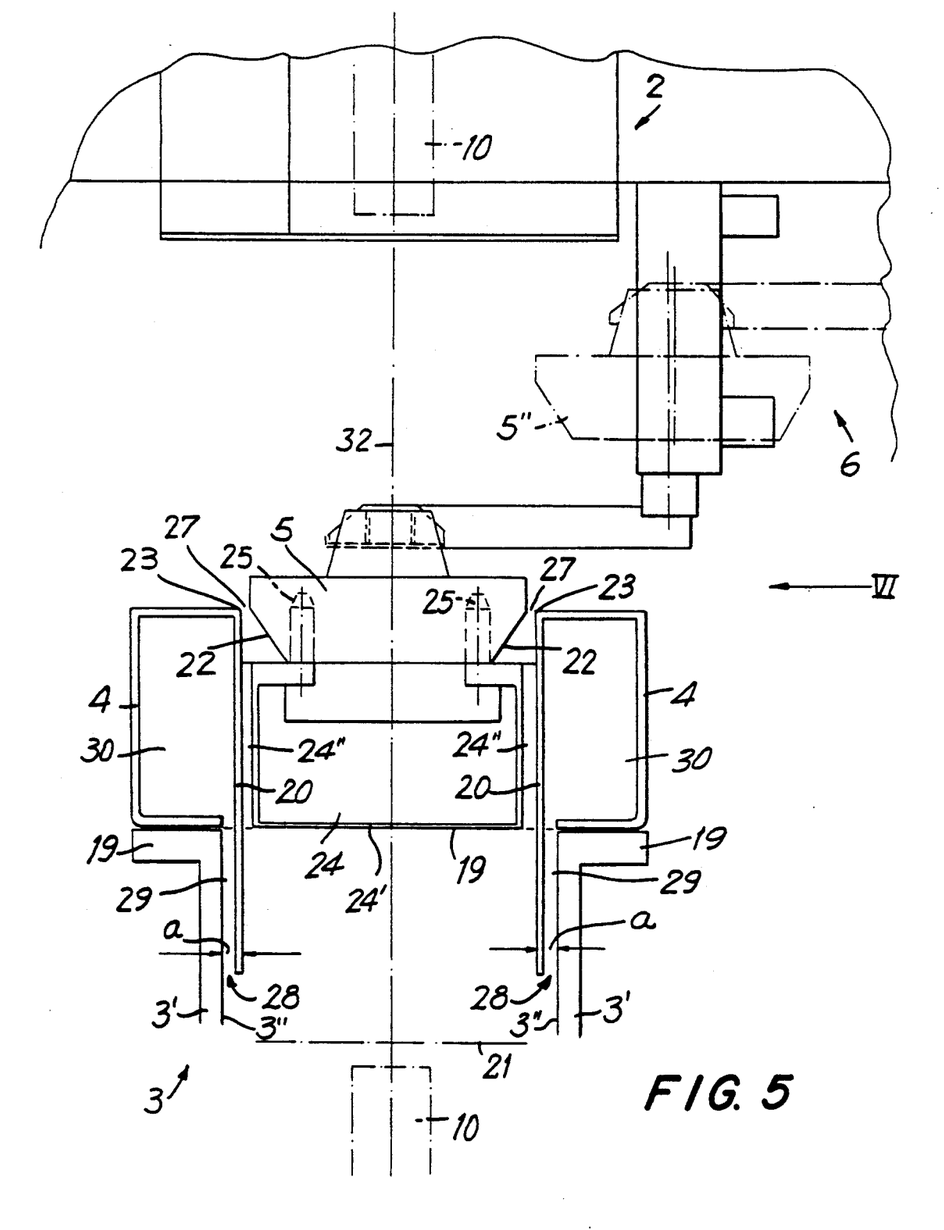
FIG. 5 is a side view of a lower region of the transporting car and the upper region of the bath container with associated parts on an enlarged scale, wherein the bath container and the aspiration cells are sectioned.
Figure 6:
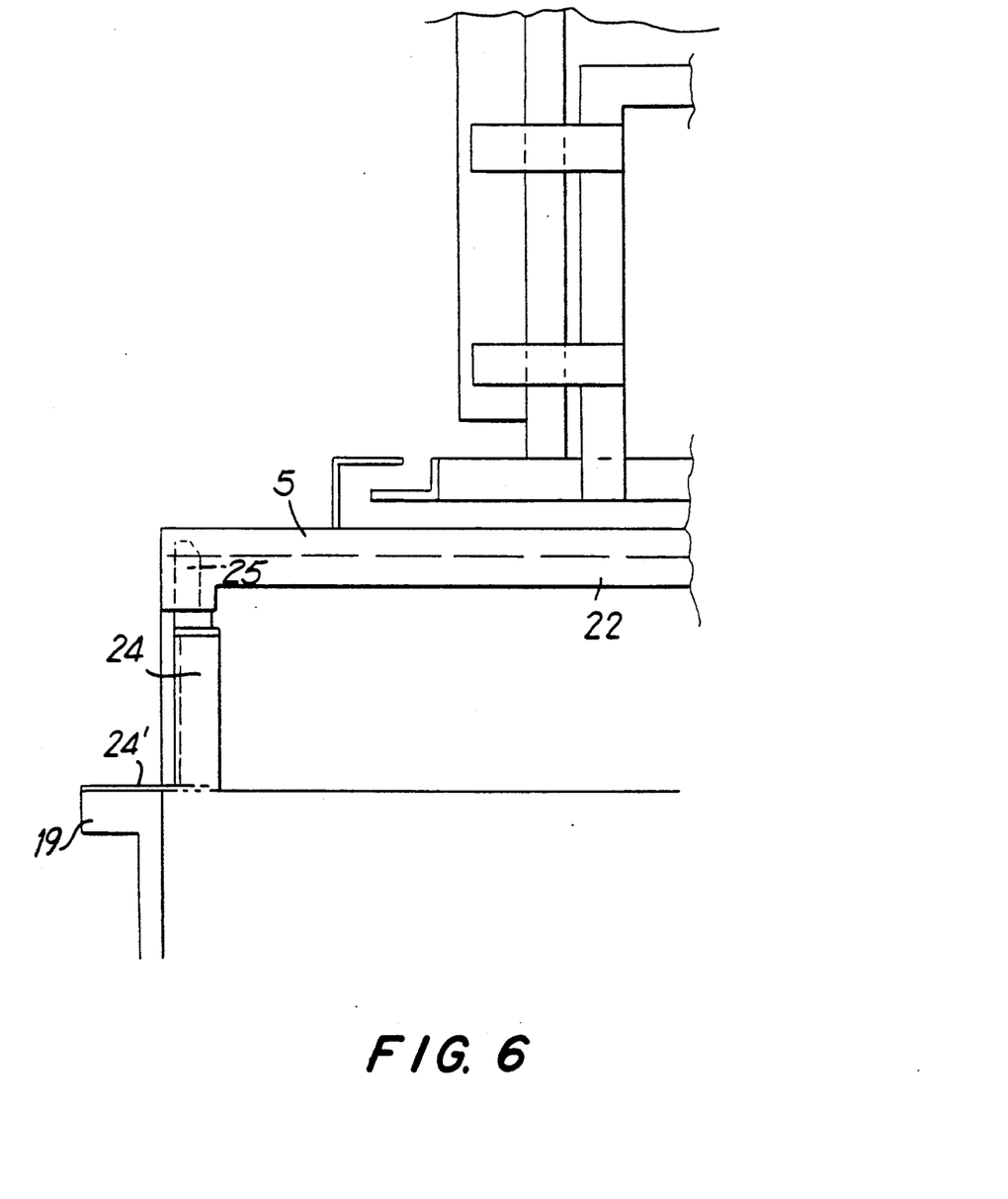
FIG. 6 is a partial view as seen in direction of the arrow VI in FIG. 5.

The cover 5 which extends over the whole length of the container 3 as shown in FIG. 6 is conically downwardly reducing in its side surfaces 22. This serves for placing the cover in connection with the upper inner edges 23 of the aspiration cells 4 for a centering of the cover relative to the container and the aspiration cells. The complete covering position of the cover is activated by a holder 24 with so-called inward guidance which extends slightly conically at the upper side and pass in corresponding openings of the cover. In accordance with the embodiment of FIGS. 5 and 6, the holder 24 can be formed as a console composed of a sheet material and placed with bends 24' on the container edge 19. The inward guides 25 are arranged and mounted on these consoles, especially on the bent side edge 24'. A free space 24'' is provided between the consoles and the side walls 20 of the aspiration cells for passing the air therethrough. In contrast, the consoles prevent air from being aspirated from the respective end side of the space in a horizontal direction, or in other words perpendicular to the plane of the drawing of FIG. 5. Each such holder 24 can also be arranged on each end of the aspiration cell or the container as shown in FIG. 6.

FIG. 5 shows that the covering of the upper side of the inner space 26 of the container by the cover is not complete, but air passage slots 27 are provided at both longitudinal sides of the cover 5. Therefore aspiration is performed by a ventilator or the like, which constantly produces a negative pressure in the interior of the aspiration cell 4 for the aspiration. The air enters the space from outside through the slots 27 and flows from there in direction of the arrows 28 into the openings 29 and from there into the interior 30 of the aspiration cells. Thereby the vapors accumulated above the liquid level 21 in the space are almost completely entrained and transported away. The position of the air inlet slot in the space 29 identified with the tip of the arrow 28 can be different from the position shown in the drawings. It is important that it is located at a distance from the upper edge 23 above the aspiration cell which eliminates the above mentioned disadvantages, and the required quantity of vapors in the inner space can be withdrawn by the air stream.

Figure 7:
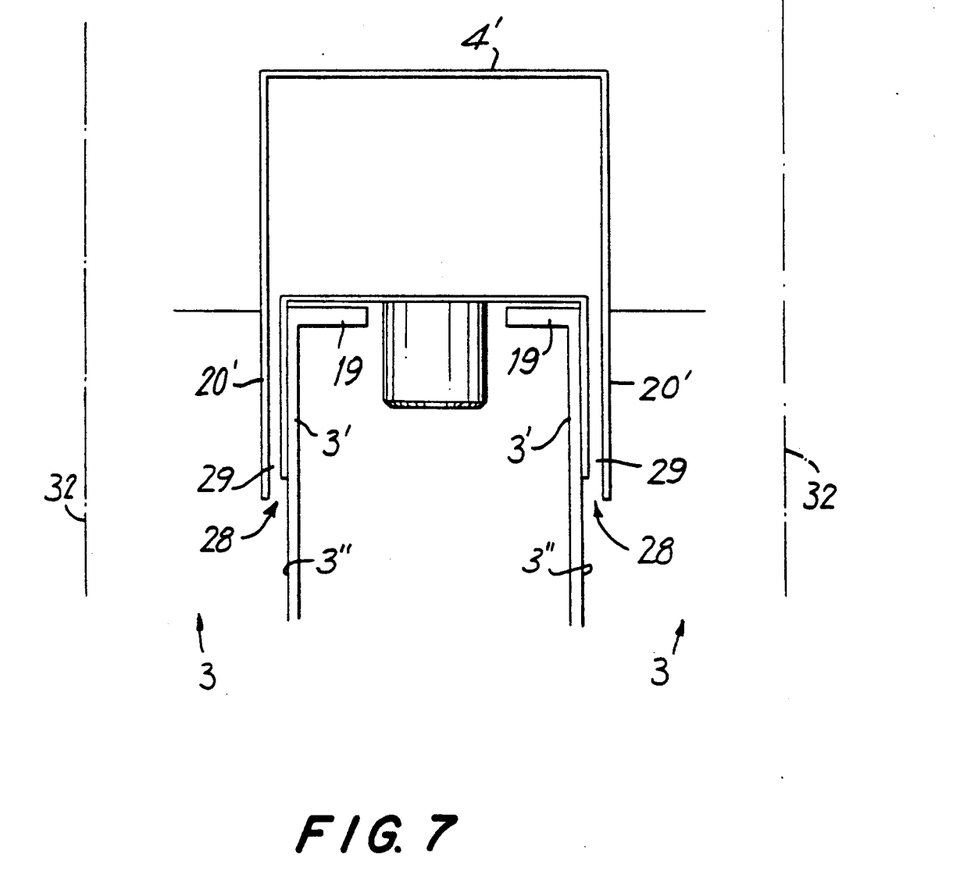
FIG. 7 is a view showing a further embodiment of the aspiration cells.

FIG. 7 shows an aspiration device in form of an aspiration cell 4', which extends over two opposite side walls 3' of two containers 3. Both side walls 20' of the aspiration cell 4' form air guides 28, 29 together with the walls 3' of the containers. The central axes of the containers 3 are identified by dash-dot lines 32.

Figure 8:
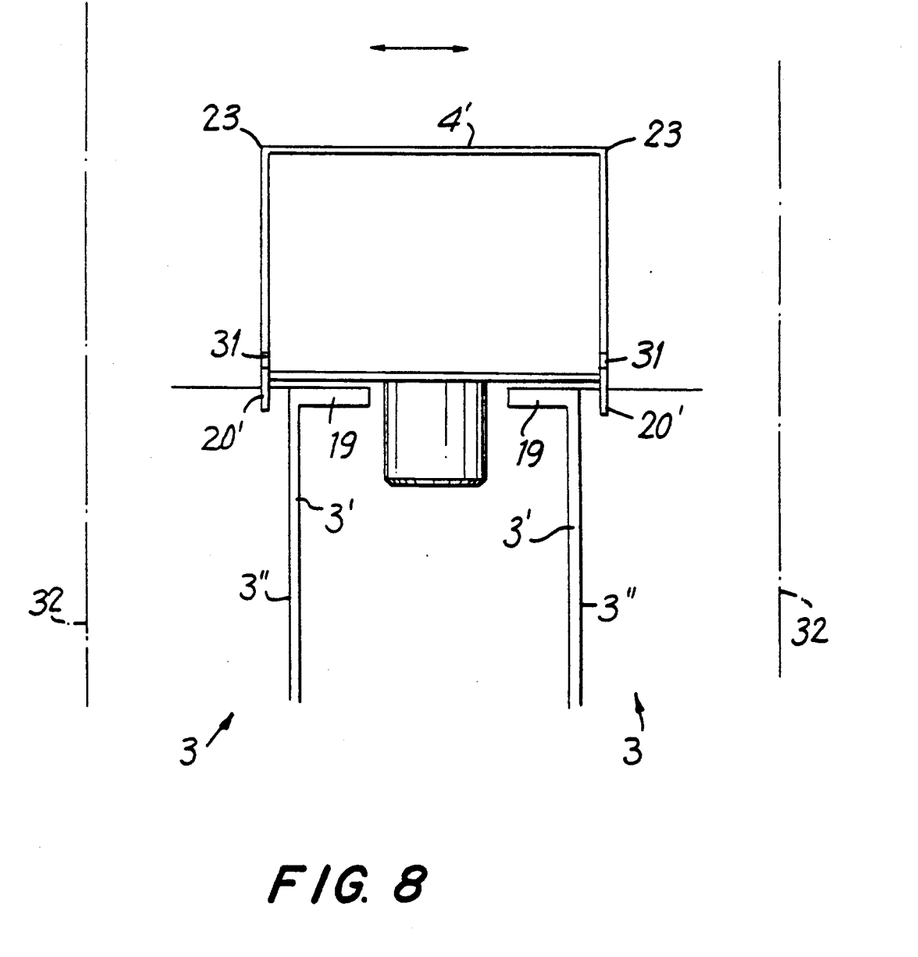
FIG. 8 is view showing a further embodiment of the arrangement in accordance with the present invention.

FIG. 8 shows an arrangement which is similar to the arrangement of FIG. 7 and has an aspiration cell 4' extending over two side walls 3'. Slots 31 are provided here for the aspiration of the air in the interior of the aspiration cell 4' in its walls. They are also arranged at a sufficient distance from the upper side or upper edge 23 of the aspiration cell 4'. The aspiration action and the avoidance of the whirling are here limited when compared with the embodiment of FIGS. 5-7, however, are still superior as compared with the prior art. The embodiment of FIG. 8 has the advantage that when only a small space is available in direction of the double arrow at the top of FIG. 8, a space is recovered in the direction since the air passage openings or slots 28 and the associated wall parts 20 or 20' are dispensed with. It is believed to be understood that the elimination of the air inlet or aspiration openings 28 and their replacement with the air inlet or aspiration slots 31 is possible not only for the aspiration cell 4' in FIG. 8, but also with the utilization of two aspiration cells 4 in accordance with the other embodiments. The side walls 20 located underneath can also be dispensed with.

It will be understood that each of the elements described above, or two or more together, may also find a useful application in other types of constructions differing from the types described above.

While the invention has been illustrated and described as embodied in an arrangement for galvanization of treatment goods in a series of baths, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. An arrangement for galvanization of treatment goods such as electronic printed circuits, comprising a plurality of successively arranged baths accommodated in bath container units having open upper sides; covers for selectively covering the upper sides of said container units; means located in said bath container units above a liquid level of a bath liquid for aspirating vapors; means for introducing and withdrawing treatment goods into and out of a bath in said bath container units, said aspirating means including air aspiration inlets located at such a distance below an upper edge of said container units that whirling of an aspirated air is substantially eliminated and a substantial part of the vapors in a space above the liquid level is entrained by the aspirated air, said air aspiration inlets being arranged above a maximum bath height, and said covers being arranged at such a height and being dimensioned relative to said bath container units so that an air passage is produced between said covers and said bath container units.

2. An arrangement as defined in claim 1, wherein each of said container units includes a container having a said upper edge.

3. An arrangement as defined in claim 1, wherein each of said bath container units has a container, said aspirating means including an aspirator provided in each said container.

4. An arrangement as defined in claim 1, wherein said aspiration inlets are formed as aspiration openings.

5. An arrangement as defined in claim 1, wherein said aspiration inlets are formed as aspiration slots.

6. An arrangement as defined in claim 1, wherein each of said container units includes a container having a container upper edge, said aspirating means having aspiration cells extending upwardly from each said container and provided with aspiration openings forming said aspiration inlets, said aspiration openings being located underneath said container upper edge.

7. An arrangement as defined in claim 6, wherein said aspiration cells extend upwardly from said container upper edge.

8. An arrangement as defined in claim 6, wherein each of said aspiration cells has a side wall facing toward an interior of each of said containers and extending at a distance from and parallel to an inner side of a respective said container, each said side wall extending downward to a height above the liquid level and said aspiration openings being spaced from said container upper edge, each said side wall forming with said inner side of a respective said container air passages extending from said aspiration openings to an interior of a respective said aspiration cell.

9. An arrangement as defined in claim 1, wherein said aspirating means includes aspiration cells having side walls, said air aspiration inlets being formed as aspiration gaps provided in said side walls of said aspiration cells which are arranged at a distance from a respective one of said upper edges.

10. An arrangement as defined in claim 1; and further comprising holding means for supporting said covers in their covering position.

11. An arrangement as defined in claim 10, wherein each of said bath container means has a container with a container wall, said holding means being provided on said container walls.

12. An arrangement as defined in claim 10, wherein said holding means are provided on said aspirating means.

13. An arrangement as defined in claim 10, wherein said holding means are provided with supports for said covers.

14. An arrangement as defined in claim 10, wherein said holding means is provided with inward guides for insuring height and side positions of said covers relative to said bath container units.

15. An arrangement as defined in claim 14, wherein said holding means includes consoles having said inward guides.

16. An arrangement as defined in claim 1, wherein said aspirating means includes aspiration cells, said covers having lower conically downwardly extending side walls for inserting said covers between said aspiration cells.

17. An arrangement as defined in claim 1, wherein each of said container units has a container having side walls, said aspirating means having aspiration cells each overlapping two of said containers and engaging over their associated side walls, said side walls extending at a distance from and parallel to respective ones of said inner sides of said containers.

18. An arrangement as defined in claim 1; and further comprising a shell for catching treatment liquid dripping from treatment goods and provided with a movement device, and a transporting car provided with a device for lifting of said covers from said container units and placing said covers to a position outside of a movement path of the treatment goods as well as for performing reverse movements, said device of said transporting car being independent from said movement device of said shell.

19. An arrangement as defined in claim 18, wherein said movement device has a drive and displaces said shell on said transporting car into a catching position under the treatment goods, and also to a non-use position located outside the movement path of said covers.

20. An arrangement as defined in claim 18, wherein said shell is displaceable relative to said transporting car.

21. An arrangement as defined in claim 18, wherein said transporting car has a spraying cabin for spraying the treatment goods withdrawn from said container units, said shell having a length which is at least equal to a width of said spraying cabin of said transporting car.

22. An arrangement as defined in claim 18, wherein said covers and said shell have drives, said lifting device and said drive of said covers, and said movement device and said drive of said shell being located at opposite sides of said transporting car.

* * * * *